(12) United States Patent
Chien et al.

(10) Patent No.: US 6,975,002 B2
(45) Date of Patent: Dec. 13, 2005

(54) SOI SINGLE CRYSTALLINE CHIP STRUCTURE

(75) Inventors: Ray Chien, Hsin Tien (TW); Honda Huang, Hsin Tien (TW)

(73) Assignee: Via Technologies, INC, Taipei Hsien (TW)

( * ) Notice: Subject to any disclaimer, the term of this patent is extended or adjusted under 35 U.S.C. 154(b) by 0 days.

(21) Appl. No.: 10/832,290

(22) Filed: Apr. 27, 2004

(65) Prior Publication Data
US 2005/0236670 A1    Oct. 27, 2005

(51) Int. Cl.[7] .............................................. H01L 27/01
(52) U.S. Cl. ..................... 257/347; 257/355; 257/356; 257/358; 257/360; 257/371
(58) Field of Search ................................ 257/355, 356, 257/358, 360, 371

(56) References Cited

U.S. PATENT DOCUMENTS 6,670,677 B2 * 12/2003 Choe et al. .................. 257/355

* cited by examiner

*Primary Examiner*—David Nelms
*Assistant Examiner*—Mai-Huong Tran
(74) *Attorney, Agent, or Firm*—Birch, Stewart, Kolasch & Birch, LLP

(57) ABSTRACT

An SOI single crystalline chip structure includes an active device layer for having at least one SOI device placed thereon, a buried oxide layer under the active device layer, a metal layer under the buried oxide layer, and a silicon substrate under the metal layer. At least one through hole passing through the buried oxide layer is disposed at a first predetermined position of the buried oxide layer, and at least one concave hole not passing through the buried oxide layer is disposed at a second predetermined position of the bottom surface of the buried oxide layer.

19 Claims, 12 Drawing Sheets

US 6,975,002 B2

SOI SINGLE CRYSTALLINE CHIP STRUCTURE

BACKGROUND OF THE INVENTION

1. Field of the Invention

The present invention relates to an SOI single crystalline chip structure, and, more particularly, to an SOI single crystalline chip structure having a metal layer filled into at least one through hole located at a predetermined position of the embedded oxide layer, and the method of manufacturing the same.

2. Description of the Prior Art

Please refer to FIG. 1 of showing a schematic diagram of an SOI single crystalline chip structure 20 according to the prior art. The SOI chip structure 20 includes a single crystal active device layer 22, a buried oxide layer 24 (thereinafter refer to as "BOX") under the active device layer 22, and a silicon substrate ground layer 26 under the BOX 24. This embodiment 20 further includes an interconnect layer 27 above the active device layer 22. The active device layer 22 is for the SOI device 28 layout. With the provision of conductive vias 31, the interconnect layer 27 will have the SOI device 28 grounded (i.e., voltage level of the SOI device 28 make reference to that of the silicon substrate 26 serving as a ground layer) and provide a means of heat dissipation.

The SOI device 28 will have the voltage level reference to the silicon substrate ground layer 26 with the settings of the interconnect layer 27 and the conductive vias 31 passing through the active device layer 22 and BOX 24. The conductive vias 31 connecting the interconnect layer 27 and silicon substrate ground layer 26 can provide grounding effect for the SOI device 28, but the contact resistance in this case is not as ideal as expected consequently. Moreover, the setting of BOX 24 places uncertainty to the performance of heat dissipation of the SOI device 28 to the silicon substrate ground layer 26. This may be caused by the result of the BOX 24 being an oxidation instead of a metal.

SUMMARY OF THE INVENTION

It is an objective of the present invention to provide a SOI single crystalline chip structure with enhanced heat dissipation function.

To achieve the objective of the present invention, the SOI single crystalline chip structure has a plurality of openings located at predetermined positions of the BOX and a corresponding metal layer filled within these openings, allowing SOI devices on the active device layer to be grounded through the metal layer. As such, the contact resistance and the heat dissipation performance will be maintained at a superior level, as opposed to the counterparts in prior arts.

It is an advantage of the present invention that the metal layer therein serves as a medium to have SOI devices on the active device layer to be electrically or/and thermally connect to the silicon ground layer more readily, meaning the contact resistances and heat dissipation performances for those SOI devices will be better than counterparts of prior art SOI single crystalline chip structures.

These and other objectives of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENT

Figure 1:
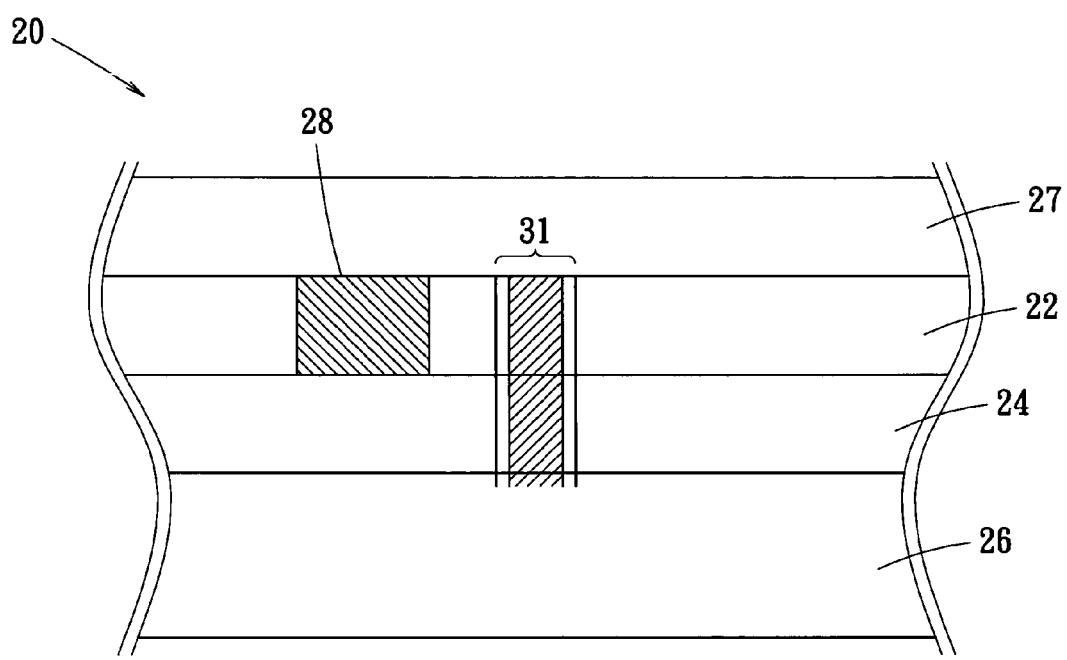
FIG. 1 is a schematic diagram showing a prior art SOI single crystalline chip structure.
Figure 2A:
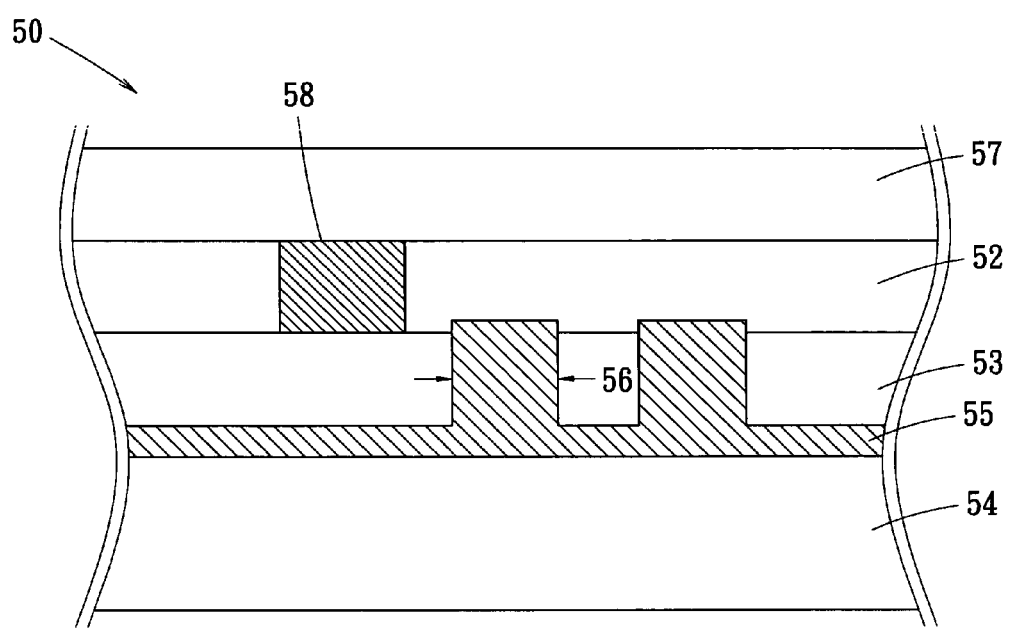
FIG. 2A is a schematic diagram showing a first embodiment according the present invention SOI single crystalline chip structure.

Please refer to FIG. 2A of a schematic diagram showing the SOI single crystalline chip 50 according to the first embodiment of the present invention. The SOI single crystalline chip 50 includes a single crystalline active device layer 52, a BOX 53, a silicon substrate 54, and a metal layer 55. This SOI single crystalline chip 50 further includes at least one through hole 56 disposed at a predetermined position of the bottom surface of the BOX 53 and passing through the BOX 53. A part of metal layer 55 is filled into the through hole 56. This SOI single crystalline chip 50 further includes an interconnect layer 57 for providing the electrical connection among the SOI devices 58 and the electrical connection between the SOI devices 58 and the silicon substrate 54.

Figure 2B:
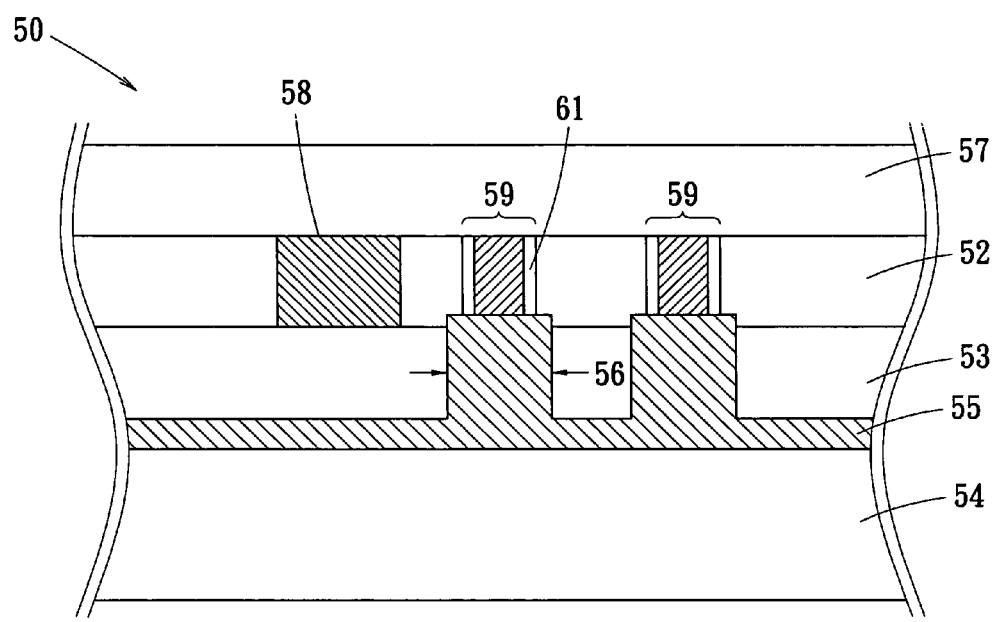
FIG. 2B is another schematic diagram of the first embodiment in FIG. 2A.

Please refer to FIG. 2B of another schematic diagram illustrating the SOI single crystalline chip 50 according to the first embodiment in FIG. 2A, wherein conductive vias 59 are disposed to connect the SOI devices 58 and the silicon substrate 54. The metal layer 55 in this embodiment is assumed to be filled into the through hole 56 passing through the BOX 53. Therefore, the SOI devices 58 are electrically connect to the silicon substrate 54 through the interconnect layer 57 as long as conductive vias 59 are connected to the metal layer 55 within the through hole 56. It should be noted that the metal layer 55 of this embodiment serves as another ground layer. Conductive vias 59 are disposed vertically with respect to the locations of through holes 56. Additionally, heat generated from operating SOI devices 58 will be dissipate more efficiently, with the setting of the metal layer 55. Each of the Conductive vias 59 further includes an isolation trench 61 encircling it. The metal layer 55 is selected from either a single layer or a multi-layer metal material. The through holes 56 are arranged in an array manner.

Figure 3A:
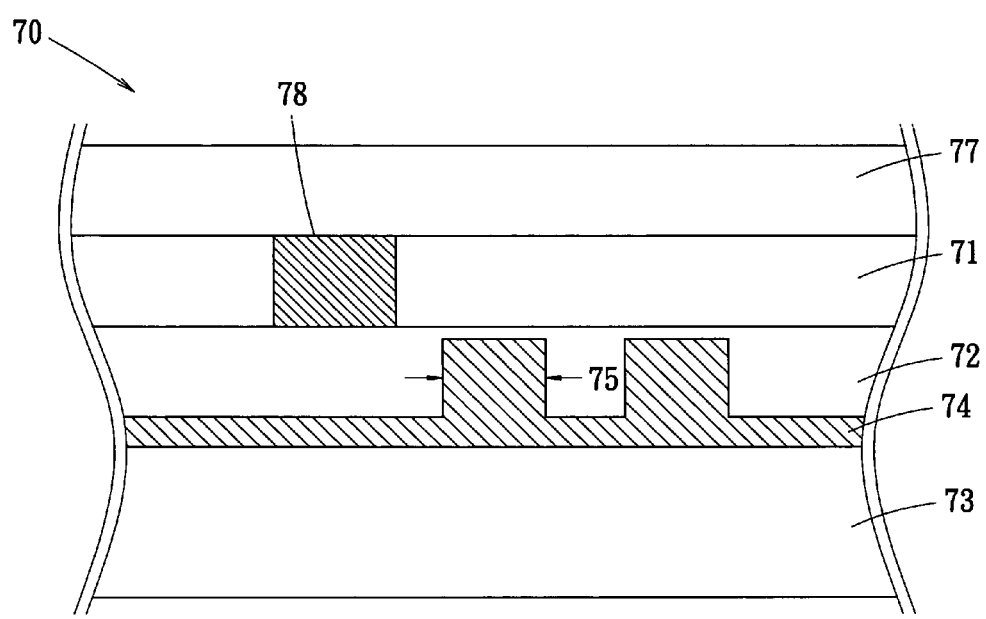
FIG. 3A is a schematic diagram showing a second embodiment according the present invention SOI single crystalline chip structure.

Please refer to FIG. 3A of a schematic diagram showing a second embodiment 70 according to the present invention. Compared with the embodiment 50, the embodiment 70 as well as includes a single crystalline active device layer 71, a BOX 72, a silicon substrate 73, and a metal layer 74. Concave holes 75 are disposed at predetermined positions on the bottom surface of the BOX 72, wherein the depth of these concave holes 75 is less than the thickness of the BOX 72, meaning that the concave holes 75 do not pass through the BOX 72. A part of the metal layer 74 is filled into each of these through holes 75. This embodiment 70 further includes an interconnect layer 77, enabling SOI devices 78 on the single crystalline active device layer 71 to have electrical connection to the interconnect layer 77.

Figure 3B:
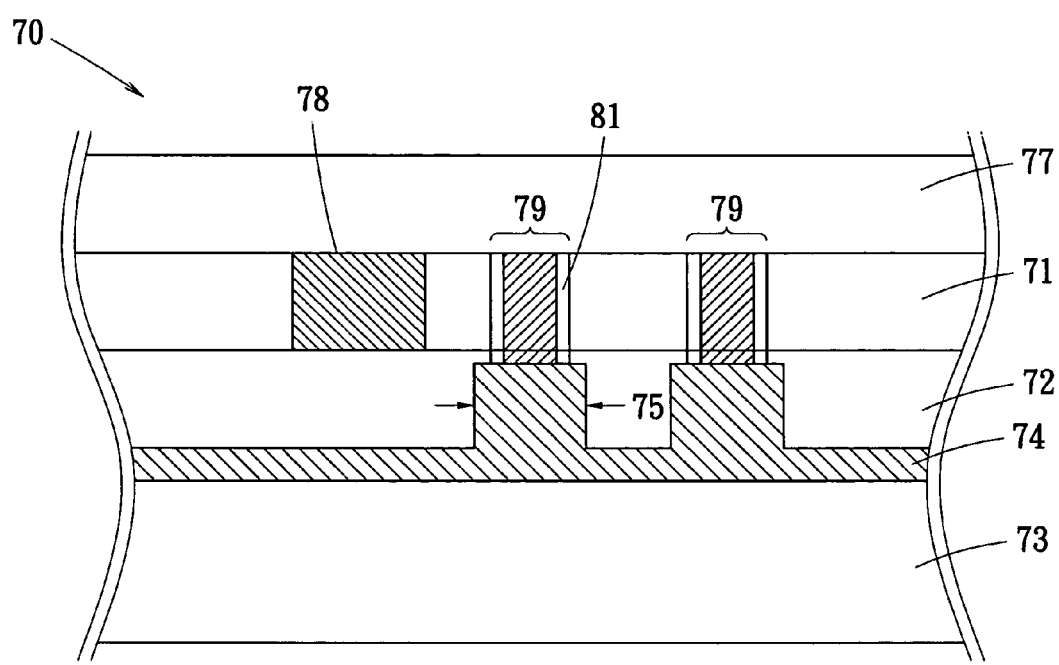
FIG. 3B is another schematic diagram of the second embodiment in FIG. 3A.

Please refer to FIG. 3B of another schematic diagram showing the second embodiment 70. With the setting of conductive vias 79, SOI devices 78 are able to connect to the silicon substrate 73. Concave holes 75 in this embodiment do not pass through the BOX 72, thus, conductive vias 79 have to punch through a part of BOX 72, so as to connect to the metal layer 74. Heat generated from operating SOI devices 78 is transferred to the silicon substrate 73 in a more efficient manner with the setting the metal layer 75. For the purpose of readily connecting the conductive vias 79 and metal layer 74, conductive vias 79 are located vertically with respect to the locations of concave holes 75, and these conductive vias 79 each includes an isolation trench 81 encircling it. The metal layer 74 in this embodiment is selected from either a single layer metal or a multi-layer metal material. Locations of concave holes 75 may correspond to those of SOI devices 78, or be arranged in an array manner.

Figure 4A:
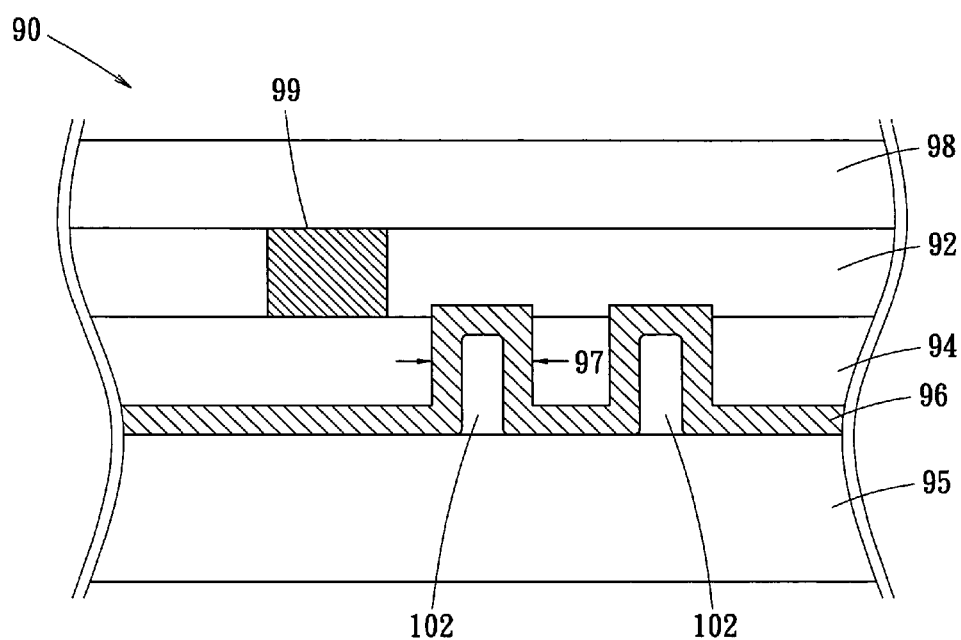
FIG. 4A is a schematic diagram showing a third embodiment according the present invention SOI single crystalline chip structure.

Please refer to FIG. 4A of a schematic diagram showing a third embodiment 90 according to the present invention. This embodiment 90 also includes a single crystalline active device layer 92, a BOX 94, a silicon substrate 95 serving as a ground layer, and a metal layer. Through holes 97 are located at predetermined positions of the bottom surface of the BOX 94 and passing through the BOX 94. A part of metal layer 96 fills into these through holes 97. This embodiment 90 further includes an interconnect layer 98, thus enabling SOI devices 99 to connect with each other through the interconnect layer 98 and to the silicon substrate 95. Thereby, the single crystalline active device layer 92 is able to connect to the silicon substrate 94 directly.

Compared with FIG. 2A, the major difference between this embodiment 90 shown in FIG. 4A and that in FIG. 2A is that the embodiment 90 includes at least one void area 102 between the metal layer 96 within through holes 97 and silicon substrate 95. The void area 102 is formed in the case of the metal layer 96 is comparatively thin, thus saving the amount of the use of metal material for the metal layer 96 and reducing the necessity of implementation of planarization manufacturing process, and ultimately having the total manufacturing cost cut down. The material selection of the metal layer 96 is either a single layer metal or multi-layer metal structure. Through holes 97 are selectively arranged in an array manner.

Figure 4B:
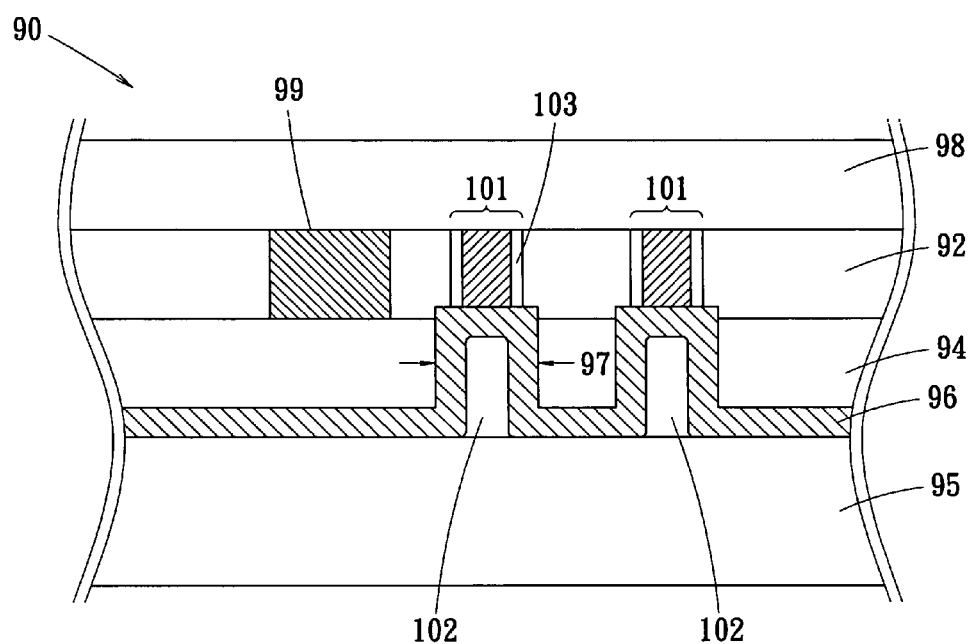
FIG. 4B is another schematic diagram of the third embodiment in FIG. 4A.

Please refer to FIG. 4B of another schematic diagram illustrating the third embodiment 90. The embodiment 90 in FIG. 4B further includes at least one conductive via 101 each further having an isolation trench 103 encircled. The metal layer 96 is assumed to be filled into through holes 97, so the conductive vias 101 are only required to be connect to the metal layer 96 within through holes 97.

Figure 5A:
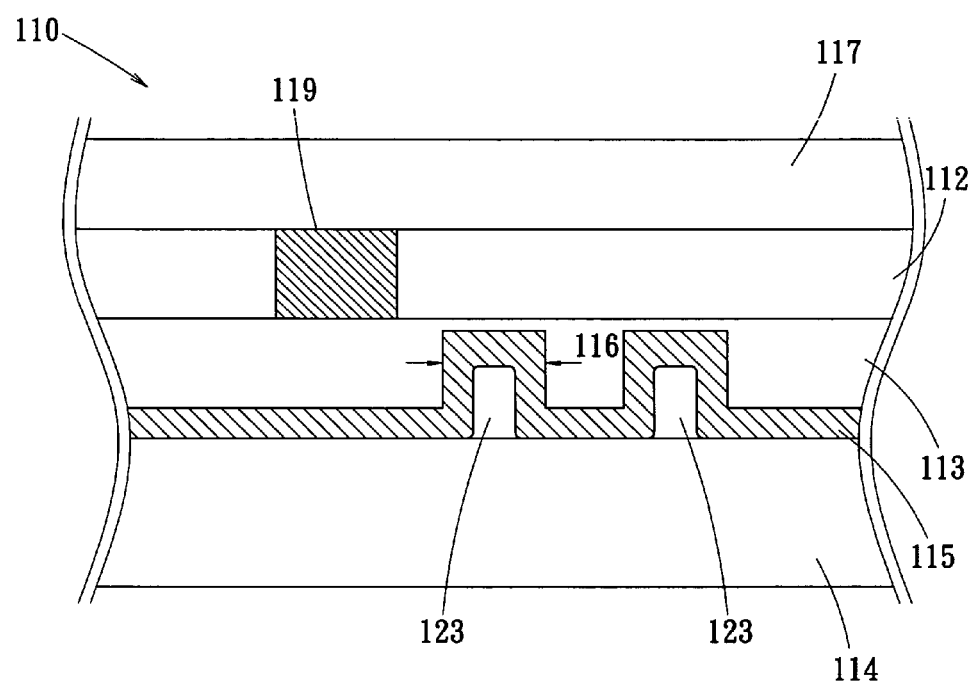
FIG. 5A is a schematic diagram showing a fourth embodiment according the present invention SOI single crystalline chip structure.

Please refer to FIG. 5A of a schematic diagram showing a fourth embodiment 110 according to the present invention. The fourth embodiment 110 of the present invention includes a single crystalline active device layer 112, a BOX 113, a silicon substrate 114, and a metal layer 115. Concave holes 116 are located at predetermined positions of the bottom surface of the BOX 113. Depth of these concave holes is smaller than the thickness of the BOX 113, and a part of metal layer 115 will be filled into these concave holes 116. This embodiment 110 further includes an interconnect layer 117, allowing SOI devices 119 at the active device layer 112 connected with each other through the interconnect layer 117. As compared with the embodiment shown in FIG. 3A, this embodiment 110 further includes at least one void area 123 between the metal layer 115 and silicon substrate 114. The void area 123 is formed in the case of having a comparatively thinner metal layer 115, for the purpose of reducing the use of metal material for forming the metal layer 115, reducing the necessity of performing the planarization manufacturing process, and ultimately cutting down the total manufacturing cost. The metal layer 115 is selected from either a single layer metal or a multi-layer metal structure. Locations of these concave holes 116 are arranged in a predetermined array manner.

Figure 5B:
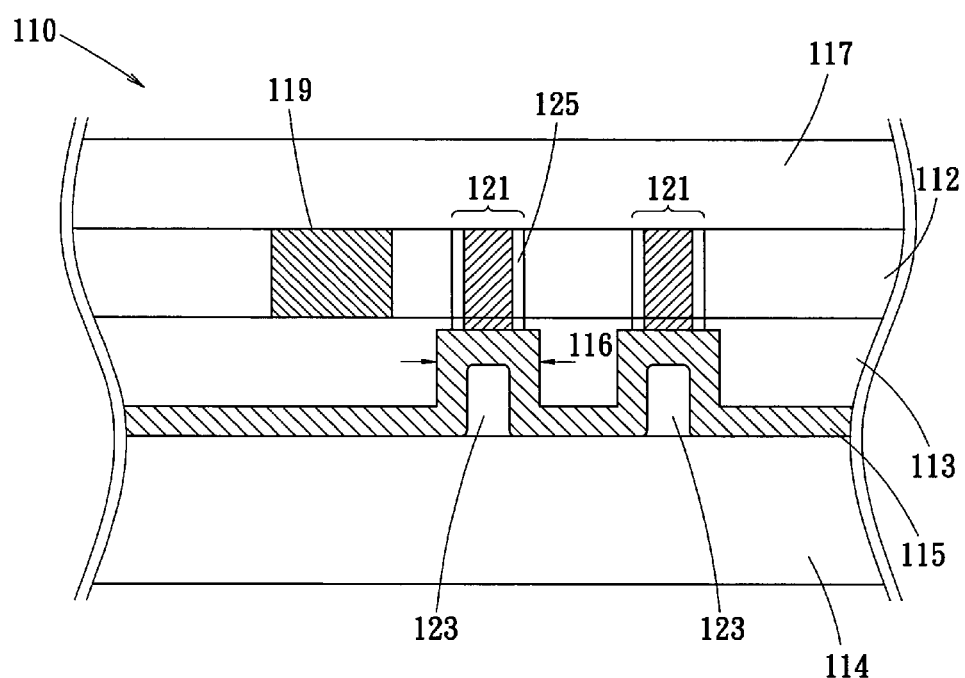
FIG. 5B is another schematic diagram of the fourth embodiment in FIG. 5A.

Please refer to FIG. 5B of another schematic diagram showing the fourth embodiment 110. In FIG. 5B, at least one conductive via 121 is fabricated and the conductive via 121 further includes an isolation trench 125 encircled. Concave holes 116 having the metal layer 115 filled do not pass through the BOX 113, resulting the conductive via 121 has to pass through a part of BOX in order to connect to the metal layer 115. Concave holes 116 are arranged in an array manner, preferably. As for the selection of metal layer 115, a single layer metal or a multi-layer metal structure is in the consideration.

Figure 6:
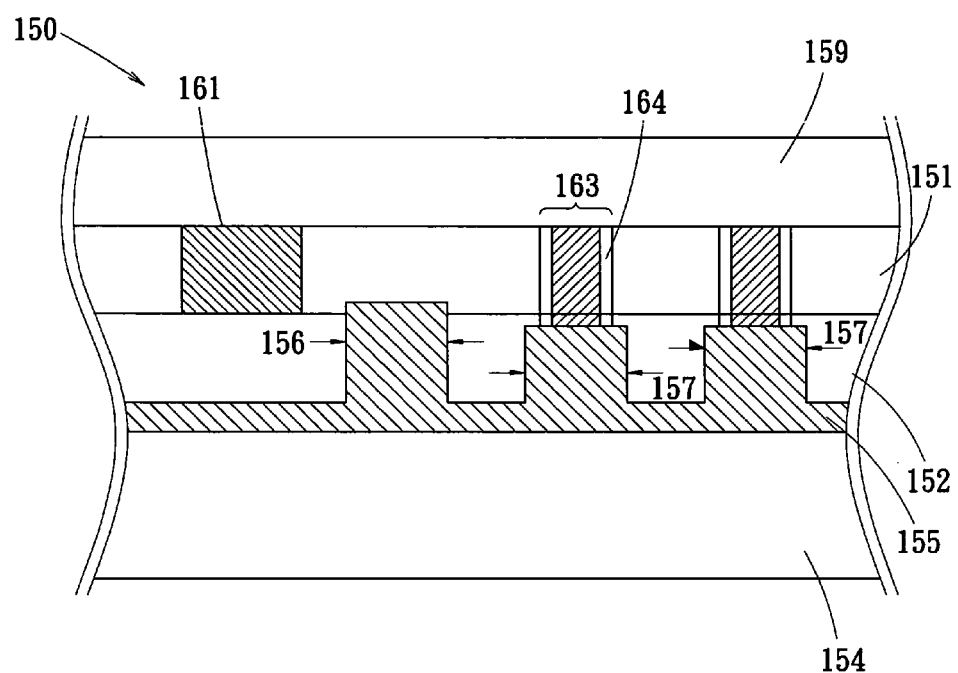
FIG. 6 is a schematic diagram of a fifth embodiment according to the present invention.

Please refer to FIG. 6 of a schematic diagram showing a fifth embodiment 150 according to the present invention. This embodiment 150 includes a single crystalline active device layer 151, a BOX 152, a silicon substrate 154, and a metal layer 155. Through holes 156 passing through the entire BOX 152 are located at first predetermined positions of the bottom surface of the BOX 152, and concave holes 157 not passing through the BOX 152 entirely are located at second predetermined positions of the same BOX bottom surface. A part of metal layer 155 is filled into the through holes 156 and the concave holes 157, respectively. This embodiment 150 further includes an interconnect layer 159, allowing SOI devices 161 at the active device layer 151 to be connected with each other and to connect to the silicon substrate 154 through the interconnect layer 154. Besides, at least one conductive via 163 is located vertically with respect to one of the positions of concave holes 157 or/and positions of through holes 156, wherein the conductive via 163 passes through the BOX 152 a little bit in order to contact with the metal layer, thereby having SOI devices grounded.

In this embodiment, the void area may be selectively to be placed between the metal layer 155 and silicon substrate 154. The conductive via 163 as well as includes an isolation trench 164 encircled. Regardless of the through holes 156 or the concave holes 157, they are preferably arranged in array manners, respectively. As for the selection of the metal layer 155, as earlier introduction, it can be either a single layer metal or a multi-layer metal structure.

Figure 7:
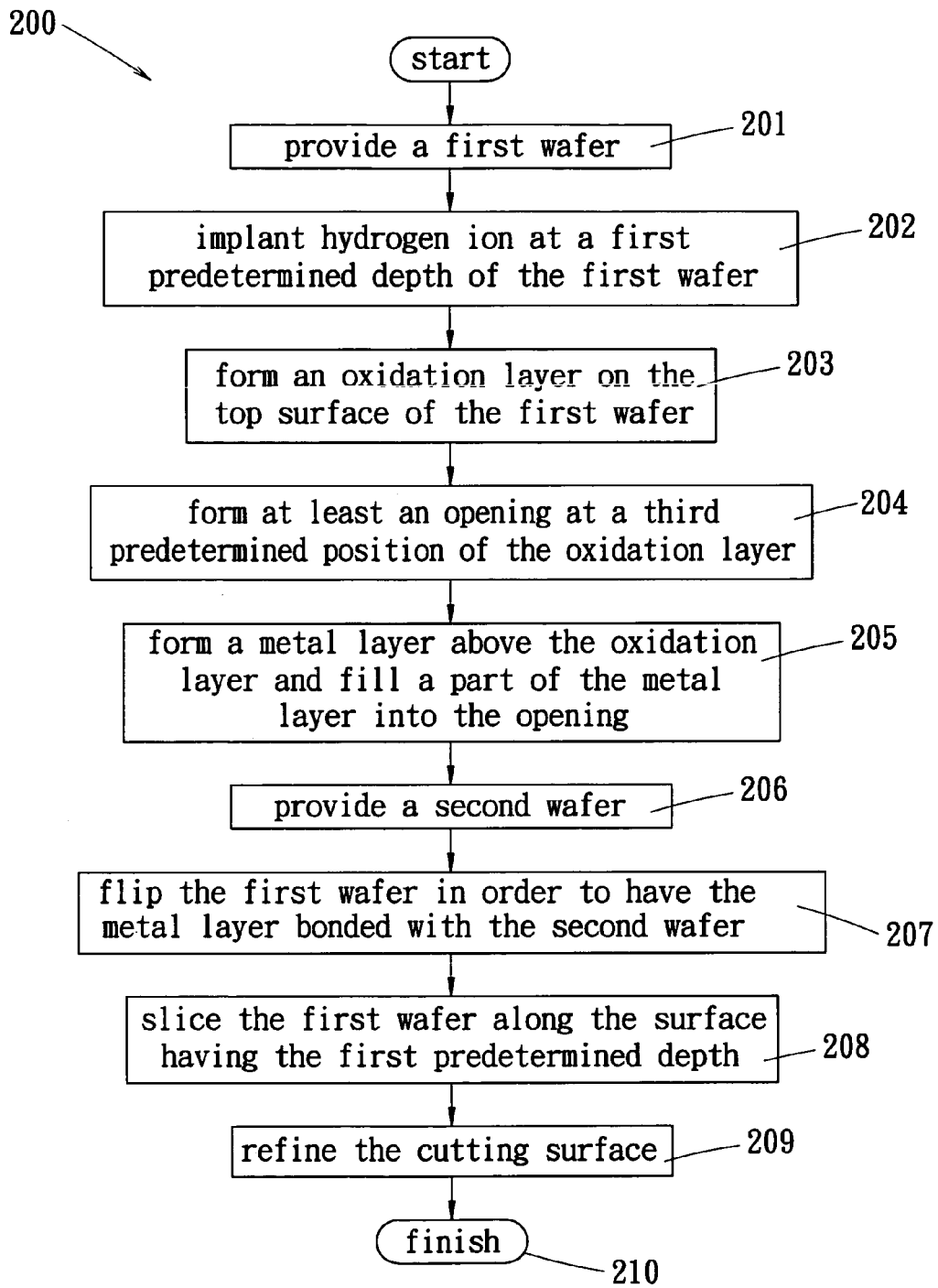
FIG. 7 is a simplified flow chart of a manufacturing method for the present invention SOI single crystalline chip structure.

Please refer to FIG. 7 illustrating a simplified flow chart of the method 200 of manufacturing the present invention SOI single crystalline chip structure. This method 200 includes steps as follows:

Step 201: provide a first wafer;
Step 202: implant hydrogen ion at a first predetermined depth of the first wafer;
Step 203: form an oxidation layer on the top surface of the first wafer;
Step 204: form at least an opening at a third predetermined position of the oxidation layer;
Step 205: form a metal layer above the oxidation layer and fill a part of the metal layer into the opening;
Step 206: provide a second wafer;
Step 207: flip the first wafer in order to have the metal layer bonded with the second wafer;
Step 208: slice the first wafer along the surface having the first predetermined depth;
Step 209: refine the cutting surface; and
Step 210: finish.

The SOI single crystalline chip structure is formed by bonding two separate wafers together. In general, the first wafer often provides the single crystalline active device layer and has hydrogen ions implanted to the surface having a first predetermined depth calculating from the top surface of the first wafer. The surface with the first predetermined depth is where the first wafer slicing performed thereafter. An oxidation layer is further formed on the top surface (Step 203), and at least one opening is formed at a third predetermined position of the oxidation layer, wherein the opening is selectively to pass through the oxidation layer or not. Upon the oxidation layer forms a metal layer, which is selected from a group consisting of a single layer metal and a multi-layer metal structure. With the setting of the opening on the oxidation layer, a part of the metal layer is filled into the opening. Step 206 further provides a second wafer serving as a silicon substrate. The first wafer is flipped in order to bond the metal layer of the first wafer with the second wafer by a wafer bonding method. Step 208 shows a step of splitting the first wafer at the surface having the first predetermined depth with a water jet. Methods of chemical mechanical polishing (CMP) and hydrogen annealing are further employed to refine the slicing surface of the first wafer, so as to planarize the slicing surface and fix the damaged surface lattice.

In the wake of having the first wafer sliced, the present invention method further includes a step of disposing at least one SOI device on the active device layer, and a step of forming an interconnect layer on the active device layer, rendering the SOI devices to be connected to each other. A step of forming at least one conductive via preferably vertical to the position of the opening is for the purpose of connecting the interconnect layer and silicon substrate together. Meanwhile, as the opening selectively passes through the oxidation layer or not, conductive vias will selectively pass through the oxidation layer, in order to connect the metal layer within the opening, accordingly. Conductive vias each further includes an isolation trench encircled. Besides, the present method further includes a method of forming at least one void area between the metal layer of the first wafer and the second wafer following the first wafer is flipped.

Figure 8:
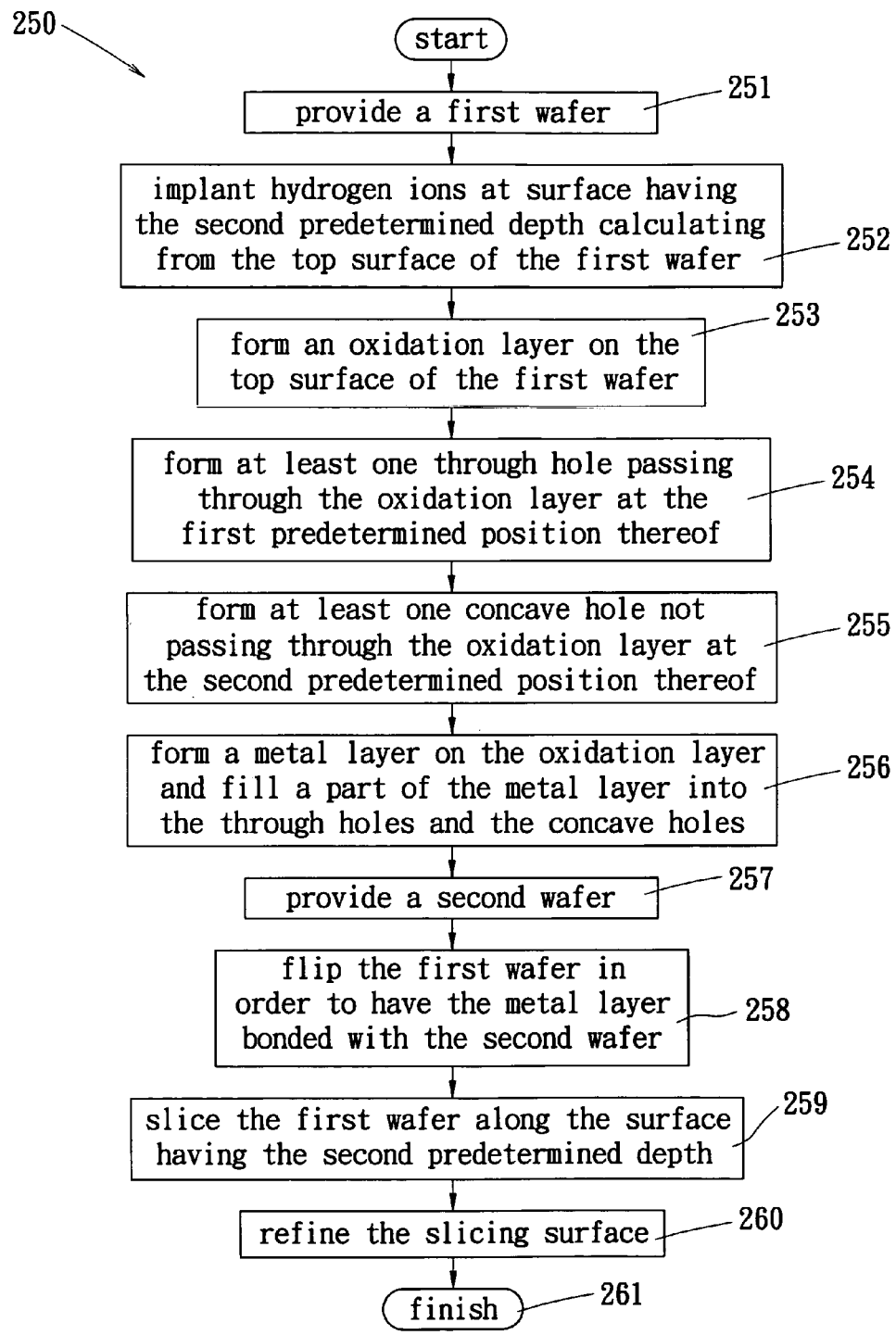
FIG. 8 is another simplified flow chart of the manufacturing method shown in FIG. 7.

Please refer to FIG. 8 of another simplified flow chart 250 of the manufacturing method for the present invention SOI single crystalline chip structure. This method embodiment 250 includes steps as follows:

Step 251: provide a first wafer;
Step 252: implant hydrogen ions at a surface having the second predetermined depth calculating from the top surface of the first wafer;
Step 253: form an oxidation layer on the top surface of the first wafer;
Step 254: form at least one through hole passing through the oxidation layer at the first predetermined position thereof;
Step 255: form at least one concave hole not passing through the oxidation layer at the second predetermined position thereof;
Step 256: form a metal layer on the oxidation layer and fill a part of the metal layer into the through holes and the concave holes;
Step 257: provide a second wafer;
Step 258: flip the first wafer in order to have the metal layer bonded with the second wafer;
Step 259: slice the first wafer along the surface having the second predetermined depth;
Step 260: refine the slicing surface; and
Step 261: finish.

Comparing with the simplified flow chart in FIG. 7, the flow chart in FIG. 8 only differentiates in forming different types (passing through the oxidation layer or not) of holes (Steps 254 and 255). Other steps such as setting conductive vias (and isolation trenches encircled these conductive vias), refining the slicing surface of the first wafer including CMP planarization and hydrogen annealing, and setting void areas between the metal layer the second wafer are all substantially as same as those in the flow chart in FIG. 7.

In contrast to the prior art, the present invention SOI single crystalline chip structure provides a metal layer under the oxidation layer (BOX). Furthermore, a part of the metal layer is filled into holes at predetermined positions of the oxidation layer, rendering conductive vias connecting the interconnect layer and the metal layer within holes, hence improving the performance of the SOI device grounding and heat dissipation.

What is claimed is:

1. A SOI single crystalline chip structure comprising:
a single crystalline active device layer for at least one SOI device layout;
a buried oxide layer under said single crystalline active device layer;
a metal layer under said buried oxide layer; and
a silicon substrate under said metal layer;
wherein at least one opening is disposed at a predetermined position of a bottom surface of said buried oxide layer, and said metal layer is located within said opening and on the bottom surface of said buried oxide layer.

2. The SOI single crystalline chip structure of claim 1, further comprising an interconnect layer upon said single crystalline active device layer for connecting said SOI devices.

3. The SOI single crystalline chip structure of claim 1, further comprising at least one conductive via disposed in a substantially vertical direction with respect to said opening, wherein said conductive via passes through said single crystalline active device layer and contacts with said metal layer.

4. The SOI single crystalline chip structure of claim 3, further comprising an isolation trench encircling said conductive via.

5. The SOI single crystalline chip structure of claim 3, wherein said conductive via is consisted of a metal material.

6. The SOI single crystalline chip structure of claim 3, wherein said conductive via is consisted of a multi-layer metal structure.

7. The SOI single crystalline chip structure of claim 1, wherein said opening is a through hole passing through said buried oxide layer, such that said metal layer within said opening connects to said single crystalline active device layer directly.

8. The SOI single crystalline chip structure of claim 1, further comprising a void area located corresponding to the inner side of said opening and between said silicon substrate and said metal layer.

9. The SOI single crystalline chip structure of claim 1, wherein said opening is a concave hole not passing through said buried oxide layer.

10. The SOI single crystalline chip structure of claim 1, wherein said metal layer is consisted of a single layer metal or a multi-layer metal structure.

11. The SOI single crystalline chip structure of claim 1, wherein said openings are arranged in an array manner.

12. A SOI single crystalline chip structure comprising:
   a single crystalline active device layer for at least one SOI device layout;
   a buried oxide layer under said single crystalline active device layer;
   a metal layer under said buried oxide layer; and
   a silicon substrate under said metal layer;
wherein at least one through hole is disposed at a first predetermined position of a bottom surface of said buried oxide layer, wherein said through hole passes through said buried oxide layer, and at least one concave hole is disposed at a second predetermined position of the bottom surface of said buried oxide layer, wherein said concave hole does not pass through said buried oxide layer, and said metal layer is located within said through hole and said concave hole and on the bottom surface of said buried oxide layer.

13. The SOI single crystalline chip structure of claim 12, further comprising an interconnect layer above said single crystalline active device layer for connecting said SOI devices.

14. The SOI single crystalline chip structure of claim 12, further comprising at least one conductive via disposed in a substantially vertical direction with respect to said concave hole, and wherein said conductive via passes through said single crystalline active device layer and said buried oxide layer and connects to said metal layer.

15. The SOI single crystalline chip structure of claim 14, further comprising an isolation trench encircling said conductive via.

16. The SOI single crystalline chip structure of claim 12, further comprising a conductive via disposed in a substantially vertical direction with respect to said through hole, and wherein said conductive via passes through said single crystalline active device layer and connects with said metal layer.

17. The SOI single crystalline chip structure of claim 12, further comprising void areas corresponding to inner sides of said through hole and said concave hole respectively and located between said silicon substrate and said metal layer.

18. The SOI single crystalline chip structure of claim 12, wherein said metal layer is consisted of a single layer metal or a multi-layer metal structure.

19. The SOI single crystalline chip structure of claim 12, wherein said through holes and said concave holes are disposed in array manners.

* * * * *